United States Patent [19]

Needham

[11] Patent Number: 4,457,796

[45] Date of Patent: Jul. 3, 1984

[54] PERMANENTLY CONNECTING A SET OF CONDUCTIVE TRACKS ON A SUBSTRATE WITH A CO-OPERATING SET ON A PRINTED CIRCUIT

[75] Inventor: Barbara Needham, Bishop's Stortford, England

[73] Assignee: ITT Industries, New York, N.Y.

[21] Appl. No.: 386,859

[22] Filed: Jun. 10, 1982

[30] Foreign Application Priority Data

Jun. 25, 1981 [GB] United Kingdom ................. 8119678

[51] Int. Cl.³ .......................... H05K 1/18; G09G 3/18
[52] U.S. Cl. .................................... 156/182; 156/276; 156/295; 174/68.5; 340/815.01; 361/398; 361/402; 361/411
[58] Field of Search ............... 361/402, 411; 174/68.5; 156/182, 276, 295

[56] References Cited

U.S. PATENT DOCUMENTS

| | | | |
|---|---|---|---|
| 2,771,969 | 11/1956 | Brownlow | 156/276 X |
| 3,134,930 | 5/1964 | Wright | 361/411 X |
| 3,688,018 | 8/1972 | Hiscocks | 361/411 X |
| 3,743,890 | 7/1973 | Neu | 361/411 X |
| 3,755,027 | 8/1973 | Gilsing | 156/182 X |
| 3,774,232 | 11/1973 | May | 361/411 X |
| 3,823,252 | 7/1974 | Schmid | 361/411 X |
| 3,864,179 | 2/1975 | Davidoff | 361/411 X |
| 3,972,755 | 8/1976 | Misfeldt | 156/182 X |
| 4,012,117 | 3/1977 | Lazzery | 361/395 X |
| 4,145,120 | 3/1979 | Kubota | 361/411 X |
| 4,388,132 | 6/1983 | Hoge et al. | 156/295 X |
| 4,413,257 | 11/1983 | Kramer et al. | 340/815.01 |

FOREIGN PATENT DOCUMENTS 2034095A  5/1980  United Kingdom .

OTHER PUBLICATIONS

Miller et al., Making Flexible Circuits, IBM Tech. Disc. Bull., vol. 12, #2, Jul. 1969, p. 328.
"Riveted Joints", Van Nostrand's Scientific Encyclopedia, 4th Ed., D. Van Nostrand Company, Inc., 1968.

Primary Examiner—R. R. Kucia
Attorney, Agent, or Firm—T. E. Kristofferson; J. M. May

[57] ABSTRACT

A flexible printed circuit is secured with adhesive to a glass or plastics substrate. Electrical connection between the tracks of the printed circuit and co-operating tracks on the substrate is made by way of conductive fibers with which the adhesive is loaded in such a proportion that no bridging electrical contact is established between laterally adjacent tracks.

6 Claims, 3 Drawing Figures

Fig.3.

PERMANENTLY CONNECTING A SET OF CONDUCTIVE TRACKS ON A SUBSTRATE WITH A CO-OPERATING SET ON A PRINTED CIRCUIT

BACKGROUND OF THE INVENTION

1. Field of the Invention

This invention relates to making permanent electrical connection between a set of conductive tracks on a substrate and a co-operating set on a printed circuit. A particular application of this invention is in the making of edge connection to display devices such as liquid crystal displays.

2. Description of the Prior Art

Liquid crystal displays need some kind of connector to make contact with terminal pads on one or perhaps both of the substrates defining the liquid crystal layer. Usually these pads are of the same material as the electrodes of the display and are transparent, typically being made of indium tin oxide. A display cell may typically have between 30 and 400 such pads. Provided that they are not too numerous, and that they are not too fine, connections with these pads can sometimes be made using push-on connector sockets similar to those developed for making edge connection with printed circuit board. However, it is often found that this approach is unsatisfactory because of the frequency with which open circuit faults occur; moreover, there is the added disadvantage that the sockets tend to be relatively bulky. Finally, it is not really practical when the pitch of the pads is significantly less than 1 mm.

An alternative approach, particularly when the pads are relatively numerous and closely spaced, has been to make electrical connection between the pads and a co-operating set of conductive tracks on a piece of printed circuit by means of an elastomeric strip which is electrically non-conductive in the direction of the longitudinal axis of the strip, but is electrically conductive in planes normal to this axis. Such strip may be constructed by forming a laminate of alternate layers of electrically conductive and electrically insulating elastomeric material, with the layers extending across the strip so that the conduction of electricity in the longitudinal direction is prevented while that in transverse direction is permitted. This approach suffers from the disadvantage that the laminated elastomeric strip is relatively expensive and requires the use of some form of permanent clamping means to hold the strip in permanent compression. Such clamping means tends to be relatively bulky. The use of a fibre loaded adhesive is described in the specification of U.K. patent application No. 2 034 095 A, in which carbon fibres embedded in an adhesive matrix material are used not only to provide electrical connection between electrodes on the front and rear surfaces of a liquid crystal display cell, but also to provide spacers that will determine the spacing between the substrates carrying those electrodes; and hence, set a precise value to the thickness of the liquid crystal layer.

SUMMARY OF THE INVENTION

According to the present invention, there is provided a method of making electrical connection between a set of conductive tracks on a printed circuit and co-operating conductive tracks on a glass or plastics substrate, which method comprises interposing between the printed circuit and the substrate an adhesive including a dispersion in an electrically insulating adhesive matrix material of electrically conductive fibres of substantially uniform diameter and a predetermined length not significantly greater than the minimum separation of the tracks in the region covered by the adhesive, which length is such that no pair of tracks on the printed circuit is electrically bridged by the fibres, and urging the printed circuit and the substrate together to electrically connect the tracks with the fibres.

The invention also resides in articles incorporating a set of electrical connections between a set of conductive tracks on a glass or plastics substrate and co-operating tracks on a printed circuit when such connection has been made by the manner set forth in the preceding paragraph. The invention finds particular application when the pitch of the tracks is 1.0 mm of less.

It will be appreciated that for the purposes of making electrical connection with a printed circuit, the diameter of the fibres; and hence, the thickness of the adhesive layer, is not critical, and thus a wider variation of fibre diameter can be tolerated for this purpose than for the purpose set out in the patent specification referred to above.

It will also be appreciated that the length of the fibres is liable to be more critical for the present application particularly in instances where the terminal pads are closely spaced. In this context, it might have been thought that it would be essential to avoid the use of fibres having a length equal to or exceeding the minimum spacing between adjacent pads. However, it has been found that this is not the case because the surface of the printed circuit is not flat, but has appreciable channels whose edges are defined by the edges of the conductive tracks. When the printed circuit is initially pressed against the substrate, the last part of the excess uncured adhesive is squeezed out along these channels with the result that the fibres tend in these regions to become preferentially aligned along the direction of the channels, this effect being more pronounced in the case of the longer fibres.

BRIEF DESCRIPTION OF THE DRAWINGS

There follows a description of a method embodying the invention in a preferred form of making electrical connection between a set of terminal pads on a liquid crystal display cell and a set of co-operating conductive tracks on a piece of flexible printed circuit board. The description refers to the accompanying drawings wich show, viewed in transmission, the orientation of fibres in the space between pairs of conductive tracks of a flexible printed circuit secured with the adhesive to glass substrates provided with co-operating transparent conductive tracks of indium tin oxide.

DETAILED DESCRIPTION OF THE INVENTION

Figure 1:
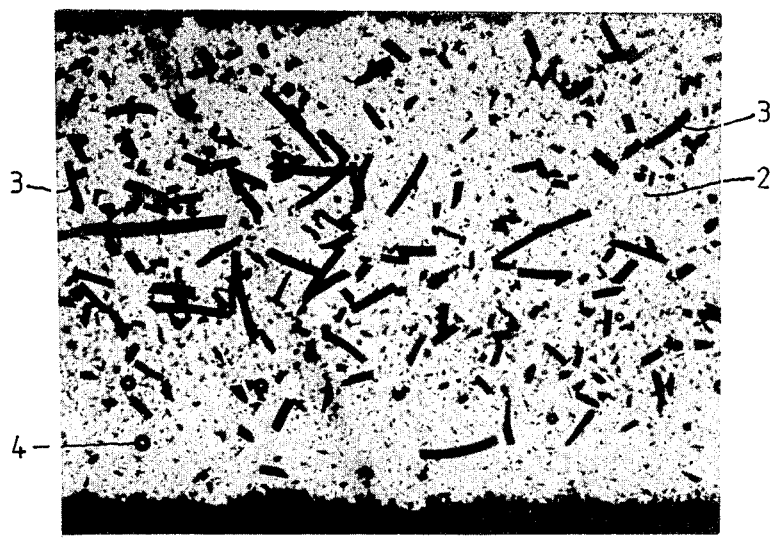
FIG. 1 is a photomicrograph showing a liquid crystal display cell having pads disposed at a pitch of 1.27 mm secured to a printed circuit in accordance with the present invention using an adhesive comprising 5 percent by weight of carbon fibres.

Referring to FIG. 1, one face of a glass substrate was provided with an electrically conductive transparent layer of indium tin oxide; and this layer was patterned in conventional manner to provide an electrode design in which the individual electrodes terminated in a line of identical pads arranged side by side in a row with spacing between adjacent pads equal to the width of a pad and the pads arranged at a pitch of approximately 1.27 mm. This electroded substrate was then used to form one part of a liquid crystal display cell. Using a special adhesive, the pads on the substrate were electrically connected with co-operating electrically conductive tracks of copper on a flexible printed circuit to form terminal connections for the display cell. The special adhesive consisted of a standard epoxy adhesive in which had been dispersed about 5 percent by weight of carbon fibre derived by grinding up graphite felt sold by La Carbone (Great Britain) Ltd. under the designation RVG1000. These fibres have a mean diameter of about 15 microns, and the grinding of the fibre in a pestel and mortar provided fragments with lengths predominantly in the range from about 20 microns to about 150 microns.

When the flexible printed circuit is placed in registry with the pads on the substrate, the intervening excess adhesive is squeezed out until the closer approach of substrate and printed circuit is prevented by the trapping of the carbon fibre fragments between the set of conductive tracks provided by the terminal pads on the substrate and the co-operating set located on the flexible printed circuit. The flexible printed circuit was formed by standard photolithographic techniques applied to a plastics sheet covered with a layer of copper approximately 35 microns thick. Removal of strips of copper so as to define the conductive tracks leaves a surface that is not flat, but has channels approximately 35 microns deep between adjacent tracks. The presence of these channels means that in the channels the fibres are not compressed firmly between two surfaces in the way they are in the regions between any opposed pair of conductive tracks. A further consequence of this configuring of the surface of the printed circuit is that the squeezing of the final amount of excess adhesive from between the substrate and the printed circuit produces a flow of adhesive concentrated along the channels which tends to align the longer carbon fragments with the longitudinal direction of the channels.

FIG. 1 of the accompanying drawings depicts a photomicrograph of part of the adhesive joint so made. This photomicrograph was made by illuminating the joint from the rear. Under these conditions, the copper conductive tracks of the flexible printed circuit show up black and the drawing shows the nearer edges of two adjacent tracks at 1. Light is able to penetrate through the regions of the flexible printed circuit from which the copper has been removed; and hence, the channel 2 between adjacent tracks appear white. Here the carbon fibre fragments 3 show up black against the white background. The photomicrograph also reveals the presence of a few bubbles in the adhesive which show up as small black rings 4.

It will be evident from this photomicrograph that with this concentration and distribution of fibres and with this track separation, there is essentially no risk of the fibres forming an electrical bridging connection between any track on the printed circuit and either of its neighbors. Electrical tests made with probes revealed that the inter-track insulation was essentially unchanged by the use of the carbon loading in the adhesive. With the adhesive covering about 6 mm of track, the use of probes indicated a resistance between an indium tin oxide track on the substrate and the corresponding copper track on the printed circuit of about 15 ohms. It was suspected, however, that a not insignificant proportion of this value may be contributed by the resistance present in the connection between the probe and the indium tin oxide, and by the indium tin oxide film itself which had a surface resistance of 15 ohms per square.

Although the foregoing has referred exclusively to the use of carbon loaded adhesive to secure a flexible printed circuit to a glass substrate, it will be apparent that the technique is not so restricted. Thus, electrically conductive fibres other than carbon fibres, such as for instance metal fibres, can be used in the adhesive, the substrate carrying the tracks can be a plastics substrate, and connection may be made direct to a rigid printed circuit board instead of a flexible printed circuit.

Accordingly, a similar piece of printed circuit was cemented with the same adhesive to a sheet of copper clad plastic using a strip of adhesive about 6 mm wide; and in this instance, the measured resistance between individual tracks on the printed circuit board and the copper cladding was about 0.1 ohms.

Figure 2:
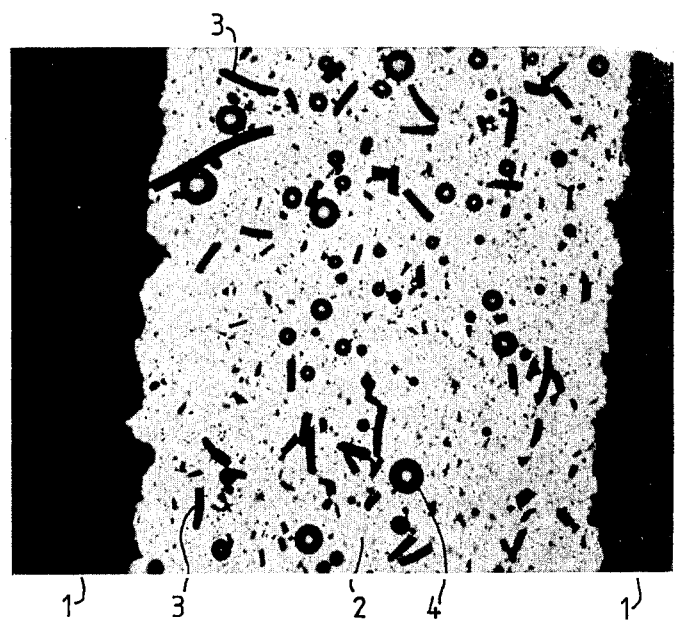
FIG. 2 is a photomicrograph showing a similar liquid crystal display cell and printed circuit assembly in which the adhesive comprises 3 percent by weight of carbon fibres.

FIG. 2 depicts a photomicrograph similar to that of FIG. 1 but in which the carbon fibre loading of the adhesive has been reduced from 5 weight percent to 3 weight percent without producing an noticeable impairment in the establishment of electrical connection between the co-operating tracks.

Figure 3:
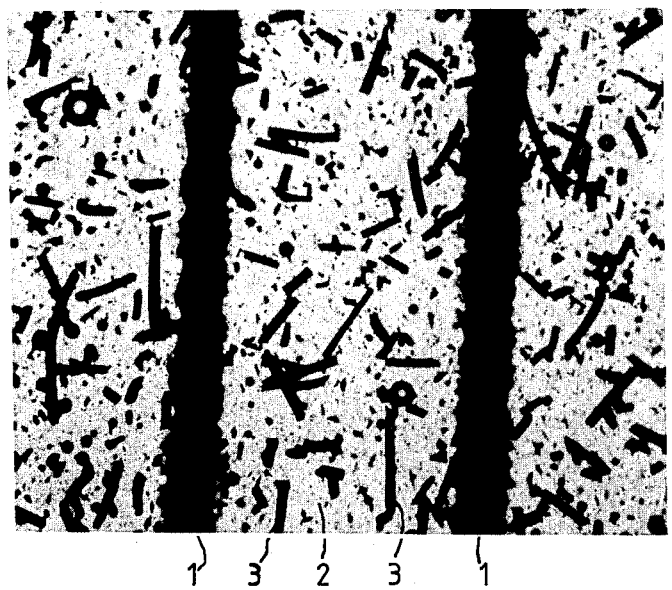
FIG. 3 is a photomicrograph showing a similar liquid crystal display cell and printed circuit assembly in which the pads of the cell are disposed at a pitch of 0.43 mm and the adhesive comprises 5 percent by weight of carbon fibres.

FIG. 3 depicts a photomigraph in which the 5 weight percent loaded adhesive was used to join a piece of printed circuit to an indium tin oxide coated glass substrate for which the pitch of the tracks was approximately 0.43 mm (17 thou).

The present invention has been described by referring to a limited number of embodiments. Those skilled in the art will recognize that modifications other than those specifically mentioned are possible within the spirit of the present invention. Therefore, the scope of the invention is not limited by the foregoing description, but rather than solely defined by the following claims.

I claim:

1. A method of making electrical and mechanical connection between a first set of conductive tracks on a non-conductive flexible printed circuit and a second set of co-operating conductive tracks on a rigid substrate, which method comprises:

providing channels on said flexible printed circuit defined by the edges of said first set of conductive tracks, interposing between the printed circuit and the substrate an excess of an adhesive compound including a dispersion in an electrically insulating adhesive matrix material of not more than 10% electrically conductive fibre fragments predominently by weight of a length greater than their mean diameter and not significantly greater than the minimum separation of the tracks in the region covered by the adhesive, said mean diameter being less than the depth of said channels and compressing the printed circuit and the substrate together to produce a flow of said adhesive compound concentrated along said channels thereby aligning at least the longer ones of said fibre fragments longitudinally in the direction of said channels and minimizing the risk of any fragments bridging adjacent tracks, to trap at least portions of said fibre fragments between said first and second set of tracks and to electrically connect each track of said first set of tracks with an associated co-operating track of said second set of tracks by means of the conductive fibre portions compressively trapped therebetween.

2. A method as claimed in claim 1 wherein the pitch of the tracks is 1.0 mm or less.

3. A method as claimed in claim 1 or 2 wherein the fibres are carbon fibres.

4. A method as claimed in claim 3 wherein the fibres of the adhesive constitute approximately 5 weight percent of the electrically insulating matrix material of the adhesive.

5. A method as claimed in claim 1 wherein the fibres are shorter than the minimum separation of the tracks in the region covered by the adhesive.

6. A method as claimed in claim 1 wherein the substrate constitutes part of a liquid crystal display cell.

* * * * *